US008405506B2

(12) United States Patent
Ben-Zion et al.

(10) Patent No.: US 8,405,506 B2
(45) Date of Patent: Mar. 26, 2013

(54) SECURE DATA ENTRY DEVICE

(75) Inventors: Yuval Ben-Zion, Shoam (IL); Ofer Itshakey, Tel-Aviv (IL)

(73) Assignee: Verifone, Inc., San Jose, CA (US)

( * ) Notice: Subject to any disclaimer, the term of this patent is extended or adjusted under 35 U.S.C. 154(b) by 311 days.

(21) Appl. No.: 12/848,471

(22) Filed: Aug. 2, 2010

(65) Prior Publication Data

US 2012/0025983 A1 Feb. 2, 2012

(51) Int. Cl.

| | |
|---|---|
| ***G08B 13/00*** | (2006.01) |
| ***G08B 13/08*** | (2006.01) |
| ***G08B 13/14*** | (2006.01) |
| ***G01R 31/08*** | (2006.01) |

(52) U.S. Cl. .................. 340/541; 340/545.2; 340/545.4; 340/545.6; 340/565; 340/571; 324/519; 324/525; 324/535

(58) Field of Classification Search .................. 340/550
See application file for complete search history.

(56) References Cited

U.S. PATENT DOCUMENTS

| | | | | |
|---|---|---|---|---|
| 3,466,643 | A | 9/1969 | Moorefield | |
| 3,735,353 | A | 5/1973 | Donovan et al. | |
| 3,818,330 | A | 6/1974 | Hiroshima et al. | |
| 4,486,637 | A | 12/1984 | Chu | |
| 4,527,030 | A | 7/1985 | Oelsch | |
| 4,593,384 | A | 6/1986 | Kleijne | |
| 4,749,368 | A | 6/1988 | Mouissic | |
| 4,807,284 | A | 2/1989 | Kleijne | |
| 4,847,595 | A | 7/1989 | Okamoto | |
| 5,086,292 | A | 2/1992 | Johnson et al. | |
| 5,117,222 | A * | 5/1992 | McCurdy et al. | 340/573.4 |
| 5,237,307 | A | 8/1993 | Gritton | |
| 5,239,664 | A | 8/1993 | Verrier et al. | |
| 5,353,350 | A | 10/1994 | Unsworth et al. | |
| 5,506,566 | A * | 4/1996 | Oldfield et al. | 340/550 |
| 5,559,311 | A | 9/1996 | Gorbatoff | |
| 5,586,042 | A | 12/1996 | Pisau et al. | |
| 5,627,520 | A | 5/1997 | Grubbs et al. | |

(Continued)

FOREIGN PATENT DOCUMENTS

| | | |
|---|---|---|
| DE | 2 241 738 | 8/1974 |
| DE | 601 01 096 | 7/2004 |

(Continued)

OTHER PUBLICATIONS

An International Preliminary Report on Patentability dated Jul. 19, 2011 which issued during the prosecution of Applicant's PCT/IL2009/000724.

(Continued)

*Primary Examiner* — Jennifer Mehmood
*Assistant Examiner* — Pameshanand Mahase
(74) *Attorney, Agent, or Firm* — Sughrue Mion, PLLC

(57) ABSTRACT

A secure data entry device including a housing, tamper sensitive circuitry located within the housing and tampering alarm indication circuitry arranged to provide an alarm indication in response to attempted access to the tamper sensitive circuitry, the tampering alarm indication circuitry including at least one conductor, a signal generator operative to transmit a signal along the at least one conductor and a signal analyzer operative to receive the signal transmitted along the at least one conductor and to sense tampering with the at least one conductor, the signal analyzer being operative to sense the tampering by sensing changes in at least one of a rise time and a fall time of the signal.

15 Claims, 8 Drawing Sheets

U.S. PATENT DOCUMENTS 5,675,319 A 10/1997 Rivenberg et al.
5,861,662 A 1/1999 Candelore
5,877,547 A 3/1999 Rhelimi
5,998,858 A 12/1999 Little et al.
6,288,640 B1 9/2001 Gagnon
6,359,338 B1 3/2002 Takabayashi
6,396,400 B1 5/2002 Epstein, III et al.
6,414,884 B1 7/2002 Defelice et al.
6,438,825 B1 8/2002 Kuhn
6,463,263 B1 10/2002 Feilner et al.
6,466,118 B1 10/2002 Van Zeeland et al.
6,563,488 B1 5/2003 Rogers et al.
6,646,565 B1 11/2003 Fu et al.
6,669,100 B1 12/2003 Rogers et al.
6,830,182 B2 12/2004 Izuyama
6,853,093 B2 2/2005 Cohen et al.
6,874,092 B1 3/2005 Motoyama et al.
6,912,280 B2 6/2005 Henry
6,917,299 B2 7/2005 Fu et al.
6,921,988 B2 7/2005 Moree
6,936,777 B1 8/2005 Kawakubo
6,995,353 B2 * 2/2006 Beinhocker .............. 250/227.14
7,170,409 B2 1/2007 Ehresvard et al.
7,270,275 B1 9/2007 Moreland et al.
7,283,066 B2 10/2007 Shipman
7,497,378 B2 3/2009 Aviv
7,675,413 B2 * 3/2010 Watts et al. .............. 340/539.22
7,772,974 B2 * 8/2010 Ehrensvard et al. ....... 340/572.1
7,784,691 B2 8/2010 Mirkazemi-Moud et al.
7,843,339 B2 11/2010 Kirmayer
7,898,413 B2 3/2011 Hsu et al.
2004/0031673 A1 2/2004 Levy
2004/0118670 A1 6/2004 Park et al.
2004/0120101 A1 6/2004 Cohen et al.
2005/0081049 A1 4/2005 Nakayama et al.
2005/0184870 A1 8/2005 Galperin et al.
2006/0049255 A1 3/2006 Von Mueller et al.
2006/0049256 A1 3/2006 Von Mueller et al.
2006/0066456 A1 * 3/2006 Jonker et al. ............. 340/870.02
2006/0192653 A1 8/2006 Atkinson et al.
2007/0040674 A1 2/2007 Hsu
2007/0102272 A1 5/2007 Sano et al.
2007/0152042 A1 7/2007 Mittler
2007/0204173 A1 8/2007 Kuhn
2008/0135617 A1 6/2008 Aviv
2008/0180245 A1 7/2008 Hsu et al.
2008/0278353 A1 11/2008 Smith et al.
2009/0058628 A1 3/2009 Kirmayer
2009/0184850 A1 7/2009 Schultz et al.
2011/0022771 A1 * 1/2011 Foerster ........................ 710/316
2011/0063109 A1 3/2011 Ostermöller
2011/0215938 A1 9/2011 Neo et al.
2011/0248860 A1 10/2011 Avital et al.
2012/0106113 A1 5/2012 Kirmayer et al.
2012/0180140 A1 7/2012 Barrowman

FOREIGN PATENT DOCUMENTS

EP 0 375 545 6/1990
EP 1 421 549 5/2004
EP 1 432 031 6/2004
EP 03257680 6/2004
EP 1 676 182 7/2006
FR 2911000 7/2008
GB 892198 3/1962
GB 1 369 739 10/1974
GB 8608277 5/1986
GB 2372363 8/2002
GB 2411756 9/2006
JP 2002108711 4/2002
JP 2003100169 4/2003
WO 01/63994 8/2001
WO 2005/086546 9/2005
WO 2009/091394 7/2009
WO 2010/082190 7/2010

OTHER PUBLICATIONS

A Notice of Allowance dated Sep. 10, 2010, which issued during the prosecution of Applicant's U.S. Appl. No. 11/845,435.

Van Ess, Dave; "Capacitive touch switches for automotive applications", http://www.automotivedesignline.com/, Feb. 2006.

Victor Kremin, et al., "Capacitive sensing—waterproof capacitance sensing", Cypress Perform, Dec. 2006.

An Office Action dated Oct. 26, 2004, which issued during the prosecution of U.S. Appl. No. 10/326,726.

An Office Action dated May 28, 2004, which issued during the prosecution of U.S. Appl. No. 10/326,726.

An Office Action dated Apr. 10, 2012, which issued during the prosecution of U.S. Appl. No. 12/758,150.

An International Search Report and a Written Opinion both dated Apr. 30, 2012, which issued during the prosecution of Applicant's PCT/US2012/020142.

* cited by examiner

SECURE DATA ENTRY DEVICE

FIELD OF THE INVENTION

The present invention relates generally to secure keypad devices and more particularly to data entry devices having anti-tamper functionality.

BACKGROUND OF THE INVENTION

The following patent publications are believed to represent the current state of the art:

U.S. Pat. Nos. 5,506,566; 3,466,643; 3,735,353; 4,847,595 and 6,288,640; and

G.B. Patent No.: GB892,198.

SUMMARY OF THE INVENTION

The present invention seeks to provide improved secure keypad devices.

There is thus provided in accordance with a preferred embodiment of the present invention a secure data entry device including a housing, tamper sensitive circuitry located within the housing and tampering alarm indication circuitry arranged to provide an alarm indication in response to attempted access to the tamper sensitive circuitry, the tampering alarm indication circuitry including at least one conductor, a signal generator operative to transmit a signal along the at least one conductor and a signal analyzer operative to receive the signal transmitted along the at least one conductor and to sense tampering with the at least one conductor, the signal analyzer being operative to sense the tampering by sensing changes in at least one of a rise time and a fall time of the signal.

Preferably, the tamper sensitive circuitry is located within a protective enclosure within the housing and wherein the at least one conductor forms part of the protective enclosure. Additionally, at least part of the tampering alarm indication circuitry is located within the protective enclosure.

In accordance with a preferred embodiment of the present invention the at least one of the rise time and the fall time is less than the order of a time normally required for the signal to traverse the conductor.

Preferably, the at least one of the rise time and the fall time is less than a time normally required for the signal to traverse the conductor. Additionally, the at least one of the rise time and the fall time is less than one hundredth of the time normally required for the signal to traverse the conductor.

In accordance with a preferred embodiment of the present invention the signal analyzer compares a reference signal with the signal transmitted along the conductor. Additionally, the signal analyzer also includes a reference signal memory, operative to provide the reference signal.

Preferably, the signal analyzer includes an analog-to-digital converter and a digital signal comparator. Additionally, the reference signal is a Fast Fourier Transform (FFT) reference signal and the signal analyzer also includes a processor including FFT calculation functionality. Alternatively, the signal analyzer includes a digital-to-analog converter and an analog comparator.

In accordance with a preferred embodiment of the present invention the signal generator is also operative to provide a signal timing input to the signal analyzer.

Preferably, the at least one conductor includes a pair of conductors running in parallel to each other. Additionally, one of the pair of conductors is grounded.

In accordance with a preferred embodiment of the present invention the at least one conductor is routed parallel to a ground plate. Additionally or alternatively, the at least one conductor includes multiple conductors of different lengths.

Preferably, the at least one conductor is formed on a printed circuit substrate. Additionally or alternatively, the at least one conductor forms part of at least one of an integrated circuit and a hybrid circuit.

In accordance with a preferred embodiment of the present invention the signal generator and the signal analyzer are located within a protective enclosure defined within a secure integrated circuit

BRIEF DESCRIPTION OF DRAWINGS

The present invention will be understood and appreciated more fully from the following detailed description, taken in conjunction with the drawings in which.

DETAILED DESCRIPTION OF PREFERRED EMBODIMENTS

Figure 1A:
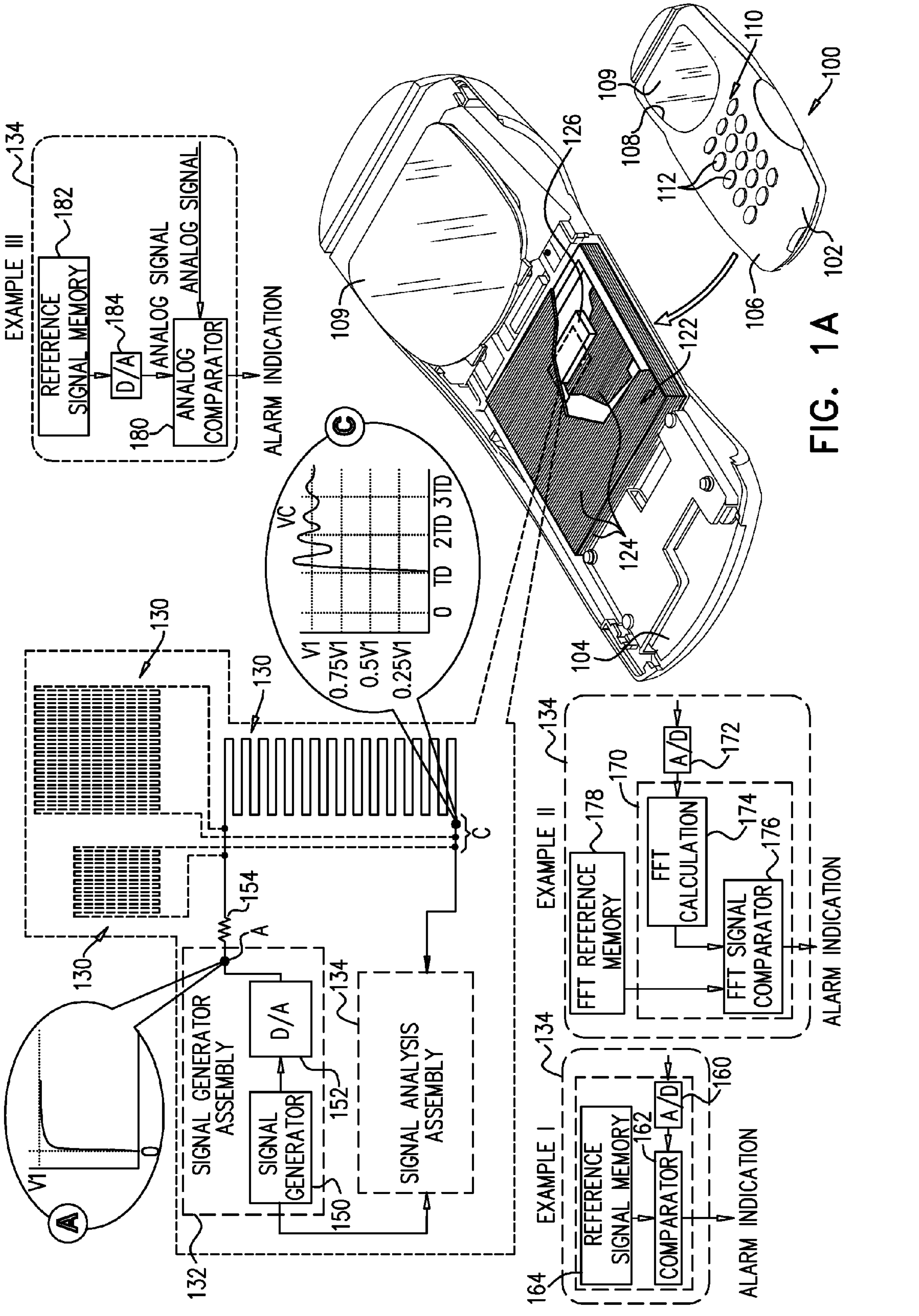
FIG. 1A is a simplified partially pictorial, partially schematic illustration of a secure keypad device constructed and operative in accordance with a preferred embodiment of the present invention.

Reference is now made to FIG. 1A, which illustrates a secure keypad device 100 constructed and operative in accordance with a preferred embodiment of the present invention.

As seen in FIG. 1A, the secure keypad device 100 includes a housing, preferably including a top housing element 102 and a bottom housing element 104. Top housing element 102 includes, on a top surface 106 thereof, a display window 108, through which a display 109 may be viewed. An array 110 of keys 112 is engageable on top surface 106.

An anti-tampering grid 122, preferably formed of a multiplicity of anti-tampering electrical conductors 124, is preferably provided to define a protective enclosure within the housing. Alternatively or additionally, a protective enclosure may be defined within a secure integrated circuit 126, which may be within or outside the protective enclosure defined by grid 122.

In accordance with a preferred embodiment of the present invention, there is provided one or more conductor 130 which interconnects a signal generator assembly 132 and a signal analysis assembly 134, both of which are preferably located within the protective enclosure defined by grid 122 and may be located within a protective enclosure defined within secure integrated circuit 126. In accordance with one embodiment of the invention, when multiple conductors 130 are employed, preferably their lengths differ significantly, so that time required for an electrical signal to pass therealong differs accordingly. Alternatively, this need not be the case.

For the sake of clarity and simplicity of explanation, signal diagrams are provided in FIGS. 1A-5, all of which relate to an embodiment having a single conductor 130.

One or more conductor 130 may form part of anti-tampering grid 122 as one or more of conductors 124 and alternatively may not. Alternatively, one or more of conductors 130 may be formed on a rigid or flexible printed circuit substrate or form part of an integrated circuit or hybrid circuit. Signal generator assembly 132, one or more conductor 130 and signal analysis assembly 134 together provide tampering detection functionality, as will be described hereinbelow in greater detail.

It is appreciated that one or more conductor 130 may be a part of a pair of conductors extending in parallel to each other, wherein one of the conductors of the pair of conductors is grounded. Alternatively, one or more conductor 130 may not form part of a pair of conductors running in parallel to each other. It is also appreciated that the one or more conductor 130 may be routed parallel to a ground plate. Alternatively, the one or more conductor 130 is not routed parallel to a ground plate.

It is a particular feature of the present invention that the tampering detection functionality senses signal variations which occur very quickly in response to tampering with one or more conductor 130 or its connection to either or both of assemblies 132 and 134, typically within an elapsed time of approximately 100 ns and depending on the signal generator and comparator employed. These signal variations typically occur within an elapsed time which is less than 100 nanoseconds or even as short as 1 nanosecond. Preferably, the elapsed time during which tampering responsive signal variations take place is generally of the order of the time required for the signal to pass along the length of each conductor 130 or less.

A preferred length of electrical conductor 130 is about 75 in. for a signal having a rise/fall time of approximately 10 nanoseconds (ns). The signal analysis assembly 134 preferably enables sensing tampering attempts in an electrical conductor 130 as short as 6 inches, wherein the signal has a rise/fall time of one nanosecond. The time required for an electrical signal to pass along a typical conductor 130 embodied in a conventional FR4 PCB is 140-180 picoseconds/inch (ps/in).

In accordance with a preferred embodiment of the present invention, signal generator assembly 132 comprises a signal generator 150, such as a Xilinx 7 Series FPGA, commercially available from Xilinx, Incorporated of San Jose, Calif., which outputs, via a Digital to Analog (D/A) converter 152, such as a TI-DAC 5670, commercially available from Texas Instruments, operating at 2.4 Gigasamples/second, a signal typically having a rise time of the order of 10 ns and a duration of the order of 150 ns. This signal preferably is repeated every 1 ms. The time duration required for the signal to traverse a conductor 130, here designated TD, is typically of the order of tens of nanoseconds. A simplified signal diagram illustrating the rise of the output of D/A converter 152 appears at A. In this simplified example, the signal rises nearly instantaneously to a voltage V1, typically 3 volts.

The signal output of D/A converter 152 is applied to one or more conductor 130 via a resistor 154 and is supplied via the one or more conductor 130 to a junction C and thence to signal analysis assembly 134, which also receives a signal timing input from signal generator assembly 132. A simplified signal diagram illustrating the rise of a signal supplied from one conductor 130 to signal analysis assembly 134 appears as signal diagram C. It is seen that the rise of the signal at C is delayed from time 0 by time duration TD and, where the resistance of conductor 130 is generally equal to the resistance of resistor 154, the resulting signal rises nearly instantaneously after delay TD to V1 and includes harmonics about voltage V1.

Signal analysis assembly 134 may be embodied in a number of different ways, three examples of which are described hereinbelow and shown in FIG. 1A as Examples I, II and III.

In Example I, signal analysis assembly 134 preferably comprises an Analog to Digital (A/D) converter 160, such as an ADC12D18-x00, commercially available from National Semiconductor, which operates at 3.6 Giga samples per second, which receives a signal at junction C from one or more conductor 130 and supplies it to a signal comparator 162, such as a NL27WZ86, commercially available from On-Semi, Phoenix Ariz., USA. Comparator 162 also receives a reference signal C from a reference signal memory 164, which reference signal represents the signal at C in the absence of tampering. Should the signal received from one or more conductor 130 not match the reference signal in the signal reference memory 164 within predetermined tolerances, a tampering alarm indication is provided by the comparator 162.

In a non-tampered situation, reference signal C is identical to the input received by comparator 162 from A/D converter 160 and no alarm indication is provided.

In Example II, signal analysis assembly 134 preferably comprises a microprocessor 170, such as a TMS320C6X commercially available from Texas Instruments, which receives the signal at junction C via an A/D converter 172. The input from A/D converter 172 is supplied to Fast Fourier Transform (FFT) calculation functionality 174 of microprocessor 170. An FFT calculation result is supplied by FFT calculation functionality 174 to signal comparator functionality 176 of microprocessor 170. Comparator functionality 176 also receives a reference signal C from a FFT reference memory 178, which FFT reference represents the signal at C in the absence of tampering. Should the FFT calculation result representing the signal received from one or more conductor 130 not match the FFT reference signal in the FFT reference memory 178 within predetermined tolerances, a tampering alarm indication is provided by the microprocessor 170.

In a non-tampered situation, the FFT reference stored in FFT reference memory 178 is identical to the input received by comparator functionality 176 from FFT calculation functionality 174 and no alarm indication is provided.

In Example III, signal analysis assembly 134 preferably comprises an analog comparator 180, such as a ADA4960-1 differential amplifier, commercially available from Analog Devices, which receives an analog signal at junction C from one or more conductor 130. Comparator 180 also receives a reference signal C from a reference signal memory 182 via a D/A converter 184, such as a TI-DAC 5670, commercially available from Texas Instruments, operating at 2.4 Gigasamples/second, which reference signal represents the signal at C in the absence of tampering. Should the signal received from one or more conductor 130 not match the reference signal in the signal reference memory 182 within predetermined tolerances, a tampering alarm indication is provided by the comparator 180.

In a non-tampered situation, reference signal C is identical to the input received by comparator 180 and no alarm indication is provided.

It is appreciated that the operation of signal generator assembly 132 and of signal analysis assembly 134 preferably takes place continuously whether or not the secured keypad device is being used and whether or not it is in operation.

It is appreciated that any suitable signal having a fast rise or fall may be employed. Although a square wave signal is illustrated, it is appreciated that the signal need not be a square wave. Different signal configurations may be employed at different times.

Figure 1B:
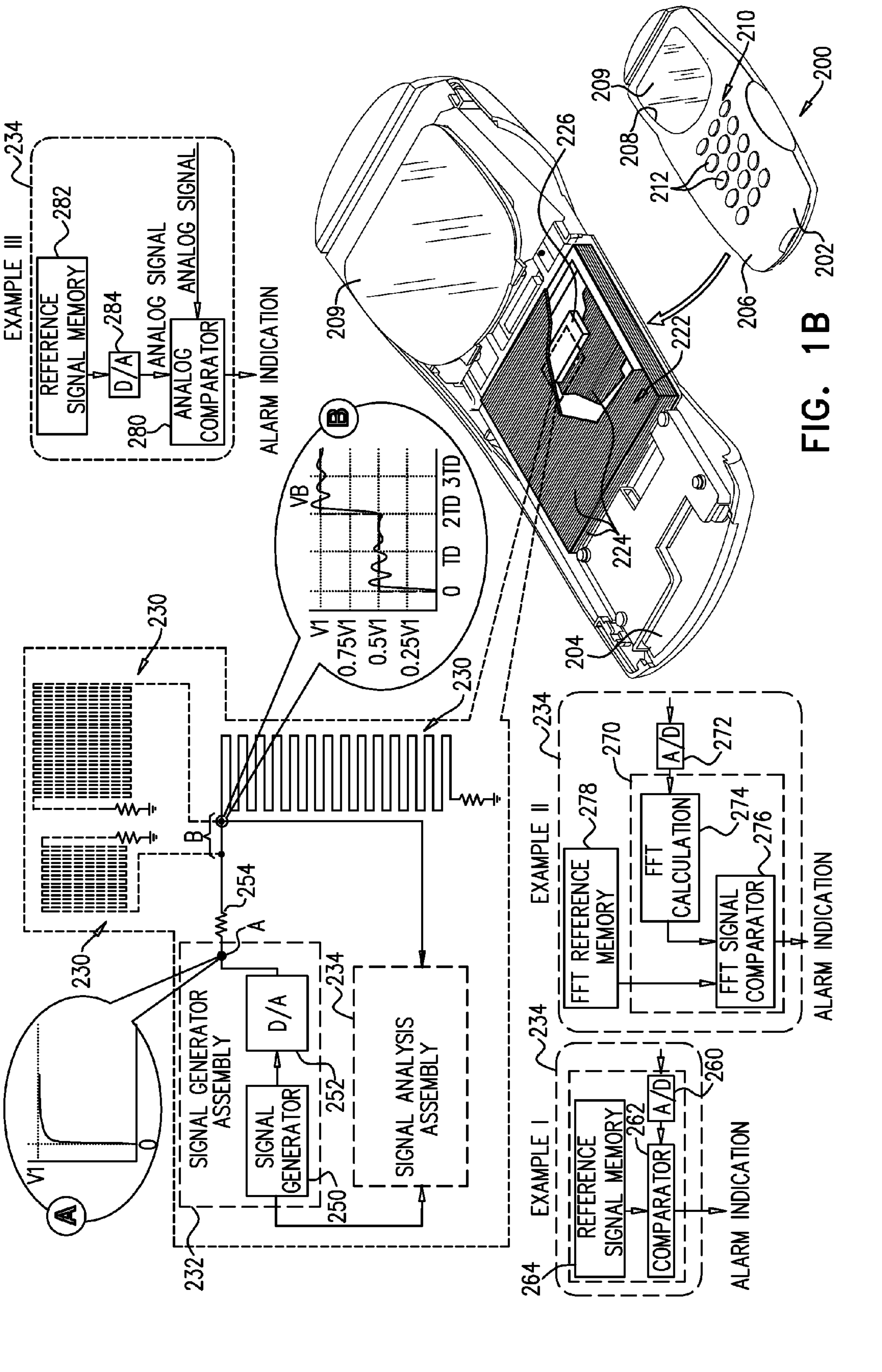
FIG. 1B is a simplified partially pictorial, partially schematic illustration of a secure keypad device constructed and operative in accordance with another preferred embodiment of the present invention.

Reference is now made to FIG. 1B, which illustrates a secure keypad device 200 constructed and operative in accordance with another preferred embodiment of the present invention.

As seen in FIG. 1B, the secure keypad device 200 includes a housing, preferably including a top housing element 202 and a bottom housing element 204. Top housing element 202 includes, on a top surface 206 thereof, a display window 208, through which a display 209 may be viewed. An array 210 of keys 212 is engageable on top surface 206.

An anti-tampering grid 222, preferably formed of a multiplicity of anti-tampering electrical conductors 224, is preferably provided to define a protective enclosure within the housing. Alternatively or additionally, a protective enclosure may be defined within a secure integrated circuit 226, which may be within or outside the protective enclosure defined by grid 222.

In accordance with a preferred embodiment of the present invention, there is provided one or more conductor 230 which interconnects a signal generator assembly 232 and a signal analysis assembly 234, both of which are preferably located within the protective enclosure defined by grid 222 and may be located within a protective enclosure defined within secure integrated circuit 226. In accordance with one embodiment of the invention, when multiple conductors 230 are employed, preferably their lengths differ significantly, so that time required for an electrical signal to pass therealong differs accordingly. Alternatively, this need not be the case.

One or more conductor 230 may form part of anti-tampering grid 222 as one or more of conductors 224 and alternatively may not. Alternatively, one or more of conductors 230 may be formed on a rigid or flexible printed circuit substrate or form part of an integrated circuit or hybrid circuit. Signal generator assembly 232, one or more conductor 230 and signal analysis assembly 234 together provide tampering detection functionality, as will be described hereinbelow in greater detail.

It is appreciated that one or more conductor 230 may be a part of a pair of conductors extending in parallel to each other, wherein one of the conductors of the pair of conductors is grounded. Alternatively, one or more conductor 230 may not form part of a pair of conductors running in parallel to each other. It is also appreciated that the one or more conductor 230 may be routed parallel to a ground plate. Alternatively, the one or more conductor 230 is not routed parallel to a ground plate.

It is a particular feature of the present invention that the tampering detection functionality senses signal variations which occur very quickly in response to tampering with one or more conductor 230 or its connection to either or both of assemblies 232 and 234, typically within an elapsed time of approximately 100 ns and depending on the signal generator and comparator employed. These signal variations typically occur within an elapsed time which is less than 100 nanoseconds or even as short as 1 nanosecond. Preferably, the elapsed time during which tampering responsive signal variations take place is generally of the order of the time required for the signal to pass along the length of each conductor 230 or less.

A preferred length of electrical conductor 230 is about 75 in. for a signal having a rise/fall time of approximately 10 ns. The signal analysis assembly 234 preferably enables sensing tampering attempts in an electrical conductor 230 as short as 6 inches, wherein the signal has a rise/fall time of a few nanoseconds. The time required for an electrical signal to pass along a typical conductor 230 embodied in a conventional FR4 PCB is 140-180 ps/in.

In accordance with a preferred embodiment of the present invention, signal generator assembly 232 comprises a signal generator 250, such as a Xilinx 7 Series FPGA, commercially available from Xilinx, Incorporated of San Jose, Calif., which outputs, via a D/A converter 252, such as a TI-DAC 5670, commercially available from Texas Instruments, operating at 2.4 Gigasamples/second, a signal typically having a rise time of the order of 10 ns and a duration of the order of 150 ns. This signal preferably is repeated every 1 ms. The time duration required for the signal to traverse a conductor 230, here designated TD, is typically of the order of tens of nanoseconds. A simplified signal diagram illustrating the rise of the output of D/A converter 252 appears at A. In this simplified example, the signal rises nearly instantaneously to a voltage V1, typically 3 volts.

The signal output of D/A converter 252 is applied to one or more conductor 230 via a resistor 254. The signal passes along one or more conductor 230 and is reflected back along one or more conductor 230 to a junction between the one or more conductor 230 and resistor 254, designated B. This signal is supplied to signal analysis assembly 234, which also receives a signal timing input from signal generator assembly 232.

A simplified signal diagram illustrating the rise of the signal supplied from junction B to signal analysis assembly 234 appears as signal diagram B. It is seen that the signal at B rises generally instantaneously to a voltage of approximately 0.5V1 and includes harmonics about voltage 0.5V1. Following a time duration 2TD, which corresponds to two traversals of one or more conductor 230, the signal rises generally instantaneously to voltage V1 and includes harmonics about voltage V1.

Signal analysis assembly 234 may be embodied in a number of different ways, three examples of which are described hereinbelow and shown in FIG. 1B as Examples I, II and III.

In Example I, signal analysis assembly 234 preferably comprises an A/D converter 260, such as an ADC12D1800, commercially available from National Semiconductor, which operates at 3.6 Giga samples per second, which receives a signal at junction B from one or more conductor 230 and supplies it to a signal comparator 262, such as a NL27WZ86, commercially available from On-Semi, Phoenix Ariz., USA. Comparator 262 also receives a reference signal B from a reference signal memory 264, which reference signal represents the signal at B in the absence of tampering. Should the signal received from one or more conductor 230 not match the reference signal in the signal reference memory 264 within predetermined tolerances, a tampering alarm indication is provided by the comparator 262.

In a non-tampered situation, reference signal B is identical to the input received by comparator 262 from A/D converter 260 and no alarm indication is provided.

In Example II, signal analysis assembly 234 preferably comprises a microprocessor 270, such as a TMS320C6X commercially available from Texas Instruments, which receives the signal at junction B via an A/D converter 272. The input from A/D converter 272 is supplied to Fast Fourier Transform (FFT) calculation functionality 274 of microprocessor 270. An FFT calculation result is supplied by FFT calculation functionality 274 to signal comparator functionality 276 of microprocessor 270. Comparator functionality 276 also receives a reference signal B from a FFT reference memory 278, which FFT reference represents the signal at B in the absence of tampering. Should the FFT calculation result representing the signal received from one or more conductor 230 not match the FFT reference signal in the FFT reference memory 278 within predetermined tolerances, a tampering alarm indication is provided by the microprocessor 270.

In a non-tampered situation, the FFT reference is identical to the input received by comparator functionality 276 from FFT calculation functionality 274 and no alarm indication is provided.

In Example III, signal analysis assembly 234 preferably comprises an analog comparator 280, such as an ADA4960-1 differential amplifier, commercially available from Analog Devices, which receives an analog signal at junction B from one or more conductor 230. Comparator 280 also receives a reference signal B from a reference signal memory 282 via a D/A converter 284, such as a TI-DAC 5670, commercially available from Texas Instruments, operating at 2.4 Gigasamples/second, which reference signal represents the signal at B in the absence of tampering. Should the signal received from one or more conductor 230 not match the reference signal in the signal reference memory 282 within predetermined tolerances, a tampering alarm indication is provided by the comparator 280.

In a non-tampered situation, reference signal B is identical to the input received by comparator 280 and no alarm indication is provided.

It is appreciated that the operation of signal generator assembly 232 and of signal analysis assembly 234 preferably takes place continuously whether or not the secured keypad device is being used and whether or not it is in operation.

It is appreciated that any suitable signal having a fast rise or fall may be employed. Although a square wave signal is illustrated, it is appreciated that the signal need not be a square wave. Different signal configurations may be employed at different times.

Figure 1C:
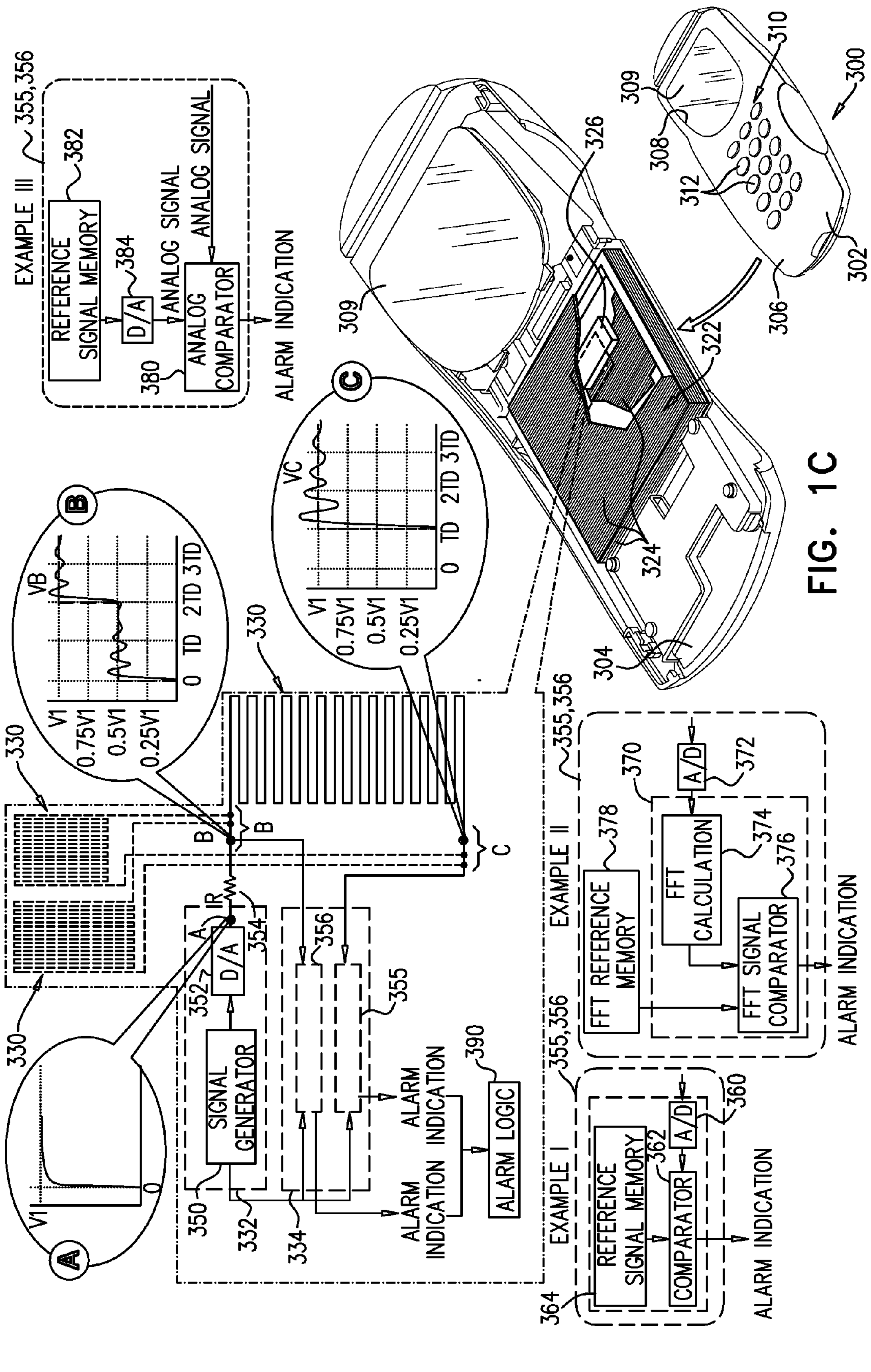
FIG. 1C is a simplified partially pictorial, partially schematic illustration of a secure keypad device constructed and operative in accordance with yet another preferred embodiment of the present invention.

Reference is now made to FIG. 1C, which illustrates a secure keypad device 300 constructed and operative in accordance with yet another preferred embodiment of the present invention.

As seen in FIG. 1C, the secure keypad device 300 includes a housing, preferably including a top housing element 302 and a bottom housing element 304. Top housing element 302 includes, on a top surface 306 thereof, a display window 308, through which a display 309 may be viewed. An array 310 of keys 312 is engageable on top surface 306.

An anti-tampering grid 322, preferably formed of a multiplicity of anti-tampering electrical conductors 324, is preferably provided to define a protective enclosure within the housing. Alternatively or additionally, a protective enclosure may be defined within a secure integrated circuit 326, which may be within or outside the protective enclosure defined by grid 322.

In accordance with a preferred embodiment of the present invention, there is provided one or more conductor 330 which interconnects a signal generator assembly 332 and a signal analysis assembly 334, both of which are preferably located within the protective enclosure defined by grid 322 and may be located within a protective enclosure defined within secure integrated circuit 326. In accordance with one embodiment of the invention, when multiple conductors 330 are employed, preferably their lengths differ significantly, so that time required for an electrical signal to pass therealong differs accordingly. Alternatively, this need not be the case.

One or more conductor 330 may form part of anti-tampering grid 322 as one or more of conductors 324 and alternatively may not. Alternatively, one or more of conductors 330 may be formed on a rigid or flexible printed circuit substrate or form part of an integrated circuit or hybrid circuit. Signal generator assembly 332, one or more conductor 330 and signal analysis assembly 334 together provide tampering detection functionality, as will be described hereinbelow in greater detail.

It is appreciated that one or more conductor 330 may be a part of a pair of conductors extending in parallel to each other, wherein one of the conductors of the pair of conductors is grounded. Alternatively, one or more conductor 330 may not form part of a pair of conductors running in parallel to each other. It is also appreciated that the one or more conductor 330 may be routed parallel to a ground plate. Alternatively, the one or more conductor 330 is not routed parallel to a ground plate.

It is a particular feature of the present invention that the tampering detection functionality senses signal variations which occur very quickly in response to tampering with one or more conductor 330 or its connection to either or both of assemblies 332 and 334, typically within an elapsed time of approximately 100 ns and depending on the signal generator and comparator employed. These signal variations typically occur within an elapsed time which is less than 100 nanoseconds or even as short as 1 nanosecond. Preferably, the elapsed time during which tampering responsive signal variations take place is generally of the order of the time required for the signal to pass along the length of each conductor 330 or less.

A preferred length of electrical conductor 330 is about 75 in. for a signal having a rise/fall time of approximately 10 ns. The signal analysis assembly 334 preferably enables sensing tampering attempts in an electrical conductor 330 as short as 6 inches, wherein the signal has a rise/fall time of a few nanoseconds. The time required for an electrical signal to pass along a typical conductor 330 embodied in a conventional FR4 PCB is 140-180 ps/in.

In accordance with a preferred embodiment of the present invention, signal generator assembly 332 comprises a signal generator 350, such as a Xilinx 7 Series FPGA, commercially available from Xilinx, Incorporated of San Jose, Calif., which outputs, via a D/A converter 352, such as a TI-DAC 5670, commercially available from Texas Instruments, operating at 2.4 Gigasamples/second, a signal typically having a rise time of the order of 10 ns and a duration of the order of 150 ns. This signal preferably is repeated every 1 ms. The time duration required for the signal to traverse a conductor 330, here designated TD, is typically of the order of tens of nanoseconds. A simplified signal diagram illustrating the rise of the output of D/A converter 352 appears at A. In this simplified example, the signal rises nearly instantaneously to a voltage V1, typically 3 volts.

The signal output of D/A converter 352 is applied to one or more conductor 330 via a resistor 354 and is supplied via the one or more conductor 330 to a junction C and thence to a signal analysis subassembly 355 of signal analysis assembly 334, which also receives a signal timing input from signal generator assembly 332.

A simplified signal diagram illustrating the rise of a signal supplied from one conductor 330 to signal analysis assembly 334 appears as signal diagram C. It is seen that the rise of the signal at C is delayed from time 0 by time duration TD and, where the resistance of conductor 330 is generally equal to the resistance of resistor 354, the resulting signal rises nearly instantaneously after delay TD to V1 and includes harmonics about voltage V1.

In this embodiment the signal passes along conductor 330 and a portion thereof is reflected back along conductor 330 to a junction between the conductor 330 and resistor 354, designated B. A signal from junction B is supplied to a signal analysis subassembly 356 of signal analysis assembly 334, which also receives a signal timing input from signal generator assembly 332.

A simplified signal diagram illustrating the rise of the signal supplied from junction B to signal analysis subassembly 356 appears as signal diagram B. It is seen that the signal at B rises generally instantaneously to a voltage of approximately 0.5V1 and includes harmonics about voltage 0.5V1. Following a time duration 2TD, which corresponds to two traversals of conductor 330, the signal rises generally instantaneously to voltage V1 and includes harmonics about voltage V1.

Each of subassemblies 355 and 356 of signal analysis assembly 334 may be embodied in a number of different ways, three examples of which are described hereinbelow and shown in FIG. 1C as Examples I, II and III.

In Example I, one or both of subassemblies 355 and 356 of signal analysis assembly 334 preferably comprises an A/D converter 360, such as an ADC112D1800, commercially available from National Semiconductor, which operates at 3.6 Giga samples per second, which receives a signal at junction C or junction B, respectively, from one or more conductor 330 and supplies it to a signal comparator 362, such as a NL27WZ86, commercially available from On-Semi, Phoenix Ariz., USA. Comparator 362 also receives a reference signal C or a reference signal B from a reference signal memory 364, which reference signal represents the signal at C or B, respectively, in the absence of tampering. Should the signal received from one or more conductor 330 not match the reference signal in the signal reference memory 364 within predetermined tolerances, a tampering alarm indication is provided by the comparator 362.

In a non-tampered situation, reference signal C or reference signal B is identical to the input received by comparator 362 from A/D converter 360 and no alarm indication is provided.

In Example II, one or both of subassemblies 355 and 356 of signal analysis assembly 334 preferably comprises a microprocessor 370, such as a TMS320C6X commercially available from Texas Instruments, which receives the signal at junction C or junction B via an A/D converter 372. The input from A/D converter 372 is supplied to Fast Fourier Transform (FFT) calculation functionality 374 of microprocessor 370. An FFT calculation result is supplied by FFT calculation functionality 374 to signal comparator functionality 376 of microprocessor 370. Comparator functionality 376 also receives a reference signal C or a reference signal B from a FFT reference memory 378, which FFT reference represents the signal at C or B, respectively, in the absence of tampering. Should the FFT calculation result representing the signal received from one or more conductor 330 not match the FFT reference signal in the FFT reference memory 378 within predetermined tolerances, a tampering alarm indication is provided by the microprocessor 370.

In a non-tampered situation, the FFT reference is identical to the input received by comparator functionality 376 from FFT calculation functionality 374 and no alarm indication is provided.

In Example III, one or both of subassemblies 355 and 356 of signal analysis assembly 334 preferably comprises an analog comparator 380, such as an ADA4960-1 differential amplifier, commercially available from Analog Devices, which receives an analog signal at junction C or junction B, respectively, from one or more conductor 330. Comparator 380 also receives a reference signal C or a reference signal B from a reference signal memory 382 via a D/A converter 384, such as a TI-DAC 5670, commercially available from Texas Instruments, operating at 2.4 Gigasamples/second, which reference signal represents the signal at C or B, respectively, in the absence of tampering. Should the signal received from one or more conductor 330 not match the reference signal in the signal reference memory 382 within predetermined tolerances, a tampering alarm indication is provided by the comparator 380.

In a non-tampered situation, reference signal C or reference B is identical to the input received by comparator 380 and no alarm indication is provided.

The alarm indications from respective signal analysis subassemblies 355 and 356 are preferably supplied to alarm logic 390, which may provide an alarm output in response to any suitable combination of alarm indications.

It is appreciated that the operation of signal generator assembly 332 and of signal analysis assembly 334 preferably takes place continuously whether or not the secured keypad device is being used and whether or not it is in operation.

It is appreciated that any suitable signal having a fast rise or fall may be employed. Although a square wave signal is illustrated, it is appreciated that the signal need not be a square wave. Different signal configurations may be employed at different times.

Figure 1D:
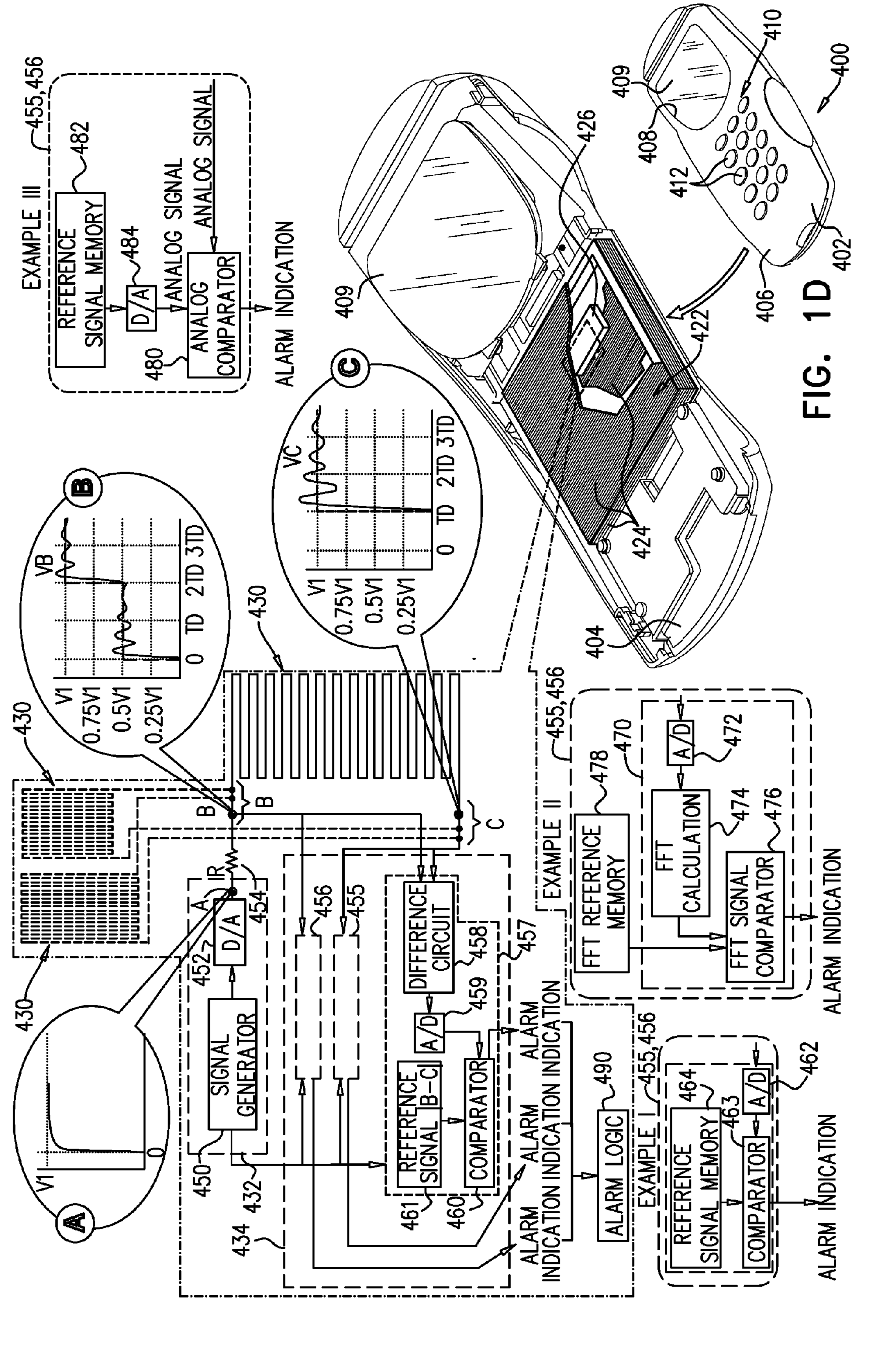
FIG. 1D is a simplified partially pictorial, partially schematic illustration of a secure keypad device constructed and operative in accordance with still another preferred embodiment of the present invention.

Reference is now made to FIG. 1D, which illustrates a secure keypad device 400 constructed and operative in accordance with still another preferred embodiment of the present invention.

As seen in FIG. 1D, the secure keypad device 400 includes a housing, preferably including a top housing element 402 and a bottom housing element 404. Top housing element 402 includes, on a top surface 406 thereof, a display window 408, through which a display 409 may be viewed. An array 410 of keys 412 is engageable on top surface 406.

An anti-tampering grid 422, preferably formed of a multiplicity of anti-tampering electrical conductors 424, is preferably provided to define a protective enclosure within the housing. Alternatively or additionally, a protective enclosure may be defined within a secure integrated circuit 426, which may be within or outside the protective enclosure defined by grid 422.

In accordance with a preferred embodiment of the present invention, there is provided one or more conductor 430 which interconnects a signal generator assembly 432 and a signal analysis assembly 434, both of which are preferably located within the protective enclosure defined by grid 422 and may be located within a protective enclosure defined within secure integrated circuit 426. In accordance with one embodiment of the invention, when multiple conductors 430 are employed, preferably their lengths differ significantly, so that time required for an electrical signal to pass therealong differs accordingly. Alternatively, this need not be the case.

One or more conductor 430 may form part of anti-tampering grid 422 as one or more of conductors 424 and alternatively may not. Alternatively, one or more of conductors 430 may be formed on a rigid or flexible printed circuit substrate or form part of an integrated circuit or hybrid circuit. Signal generator assembly 432, one or more conductor 430 and signal analysis assembly 434 together provide tampering detection functionality, as will be described hereinbelow in greater detail.

It is appreciated that one or more conductor 430 may be a part of a pair of conductors extending in parallel to each other, wherein one of the conductors of the pair of conductors is grounded. Alternatively, one or more conductor 430 may not form part of a pair of conductors running in parallel to each other. It is also appreciated that the one or more conductor 430 may be routed parallel to a ground plate. Alternatively, the one or more conductor 430 is not routed parallel to a ground plate.

It is a particular feature of the present invention that the tampering detection functionality senses signal variations which occur very quickly in response to tampering with one or more conductor 430 or its connection to either or both of assemblies 432 and 434, typically within an elapsed time of approximately 100 ns and depending on the signal generator and comparator employed. These signal variations typically occur within an elapsed time which is less than 100 nanoseconds or even as short as 1 nanosecond. Preferably, the elapsed time during which tampering responsive signal variations take place is generally of the order of the time required for the signal to pass along the length of each conductor 430 or less.

A preferred length of electrical conductor 430 is about 75 in. for a signal having a rise/fall time of approximately 10 ns. The signal analysis assembly 434 preferably enables sensing tampering attempts in an electrical conductor 430 as short as 6 inches, wherein the signal has a rise/fall time of a few nanoseconds. The time required for an electrical signal to pass along a typical conductor 430 embodied in a conventional FR4 PCB is 140-180 ps/in.

In accordance with a preferred embodiment of the present invention, signal generator assembly 432 comprises a signal generator 450, such as a Xilinx 7 Series FPGA, commercially available from Xilinx, Incorporated of San Jose, Calif., which outputs, via a D/A converter 452, such as a TI-DAC 5670, commercially available from Texas Instruments, operating at 2.4 Gigasamples/second, a signal typically having a rise time of the order of 10 ns and a duration of the order of 150 ns. This signal preferably is repeated every 1 ms. The time duration required for the signal to traverse a conductor 430, here designated TD, is typically of the order of tens of nanoseconds. A simplified signal diagram illustrating the rise of the output of D/A converter 452 appears at A. In this simplified example, the signal rises nearly instantaneously to a voltage V1, typically 3 volts.

The signal output of D/A converter 452 is applied to one or more conductor 430 via a resistor 454 and is supplied via the one or more conductor 430 to a junction C and thence to a signal analysis subassembly 455 of signal analysis assembly 434, which also receives a signal timing input from signal generator assembly 432.

A simplified signal diagram illustrating the rise of a signal supplied from one conductor 430 to signal analysis assembly 434 appears as signal diagram C. It is seen that the rise of the signal at C is delayed from time 0 by time duration TD and, where the resistance of conductor 430 is generally equal to the resistance of resistor 454, the resulting signal rises nearly instantaneously after delay TD to V1 and includes harmonics about voltage V1.

In this embodiment the signal passes along conductor 430 and a portion thereof is reflected back along conductor 430 to a junction between the conductor 430 and resistor 454, designated B. This signal is supplied to a signal analysis subassembly 456 of signal analysis assembly 434, which also receives a signal timing input from signal generator assembly 432.

A simplified signal diagram illustrating the rise of the signal supplied from junction B to signal analysis subassembly 456 appears as signal diagram B. It is seen that the signal at B rises generally instantaneously to a voltage of approximately 0.5V1 and includes harmonics about voltage 0.5V1. Following a time duration 2TD, which corresponds to two traversals of conductor 430, the signal rises generally instantaneously to voltage V1 and includes harmonics about voltage V1.

In accordance with a preferred embodiment of the present invention signals from junctions B and C are also supplied to a signal analysis subassembly 457, which forms part of signal analysis assembly 434. Signal analysis subassembly 457 also receives a signal timing input from signal generator assembly 432. Signal analysis subassembly 457 preferably includes a difference circuit 458 which provides a signal representing the difference between signals B and C. The output of the difference circuit 458 is preferably supplied via an A/D converter 459 to a comparator 460 which also receives a reference signal |B−C| from a reference signal memory 461. Should the signal received from difference circuit 458 via A/D converter 459 not match the reference signal in the signal reference memory 461 within predetermined tolerances, a tampering alarm indication is provided by the comparator 460.

In a non-tampered situation, reference signal |B−C| is identical to the input received by comparator 460 from A/D converter 459 and no alarm indication is provided. It is appreciated that in a further alternative embodiment either or both of signal analysis subassemblies 455 and 456 may be obviated.

Each of subassemblies 455 and 456 of signal analysis assembly 434 may be embodied in a number of different ways, three examples of which are described hereinbelow and shown in FIG. 1D as Examples I, II and III.

In Example I, one or both of subassemblies 455 and 456 of signal analysis assembly 434 preferably comprises an A/D converter 462, such as an ADC12D1800, commercially available from National Semiconductor, which operates at 3.6 Giga samples per second, which receives a signal at junction C or junction B, respectively, from one or more conductor 430 and supplies it to a signal comparator 463, such as a NL27WZ86, commercially available from On-Semi, Phoenix Ariz., USA. Comparator 463 also receives a reference signal C or a reference signal B from a reference signal memory 464, which reference signal represents the signal at C or B, respectively, in the absence of tampering. Should the signal received from one or more conductor 430 not match the reference signal in the signal reference memory 464 within predetermined tolerances, a tampering alarm indication is provided by the comparator 463.

In a non-tampered situation, reference signal C or reference signal B is identical to the input received by comparator 463 from A/D converter 462 and no alarm indication is provided.

In Example II, one or both of subassemblies 455 and 456 of signal analysis assembly 434 preferably comprises a microprocessor 470, such as a TMS320C6X commercially available from Texas Instruments, which receives the signal at junction C or junction B via an A/D converter 472. The input from A/D converter 472 is supplied to Fast Fourier Transform (FFT) calculation functionality 474 of microprocessor 470. An FFT calculation result is supplied by FFT calculation functionality 474 to signal comparator functionality 476 of microprocessor 470. Comparator functionality 476 also receives a reference signal C or a reference signal B from a FFT reference memory 478, which FFT reference represents the signal at C or B, respectively, in the absence of tampering.

Should the FFT calculation result representing the signal received from one or more conductor 430 not match the FFT reference signal in the FFT reference memory 478 within predetermined tolerances, a tampering alarm indication is provided by the microprocessor 470.

In a non-tampered situation, the FFT reference is identical to the input received by comparator functionality 476 from FFT calculation functionality 474 and no alarm indication is provided.

In Example III, one or both of subassemblies 455 and 456 of signal analysis assembly 434 preferably comprises an analog comparator 480, such as an ADA4960-1 differential amplifier, commercially available from Analog Devices, which receives an analog signal at junction C or junction B, respectively, from one or more conductor 430. Comparator 480 also receives a reference signal C or a reference signal B from a reference signal memory 482 via a D/A converter 484, such as a TI-DAC 5670, commercially available from Texas Instruments, operating at 2.4 Gigasamples/second, which reference signal represents the signal at C or B, respectively, in the absence of tampering. Should the signal received from one or more conductor 430 not match the reference signal in the signal reference memory 482 within predetermined tolerances, a tampering alarm indication is provided by the comparator 480.

In a non-tampered situation, reference signal C or reference B is identical to the input received by comparator 480 and no alarm indication is provided.

It is also appreciated that the portions of signal analysis subassembly 457 downstream of difference circuit 458 may alternatively be constructed and operative in accordance with any of Examples I, II and III described hereinabove.

The alarm indications from respective signal analysis subassemblies 455, 456 and 457 are preferably supplied to alarm logic 490, which may provide an alarm output in response to any suitable combination of alarm indications.

It is appreciated that the operation of signal generator assembly 432 and of signal analysis assembly 434 preferably takes place continuously whether or not the secured keypad device is being used and whether or not it is in operation.

It is appreciated that any suitable signal having a fast rise or fall may be employed. Although a square wave signal is illustrated, it is appreciated that the signal need not be a square wave. Different signal configurations may be employed at different times.

Reference is now made to FIGS. 2, 3, 4 and 5, which are simplified schematic illustrations of the operation of the secure keypad device of FIG. 1D responsive to four different types of tampering. For the sake of clarity and simplicity of explanation, FIGS. 2-5 relate to an embodiment of FIG. 1D having a single conductor 430 and wherein the signal analysis assembly 434 is constructed and operative in accordance with Example I, as described hereinabove. It is appreciated that the explanations below which relate to FIGS. 2, 3, 4 and 5 are also applicable with appropriate modifications to the embodiments of any of FIGS. 1A-1C and to any of Examples I, II and III and to any suitable number of conductors 130, 230, 330 and 430.

Figure 2:
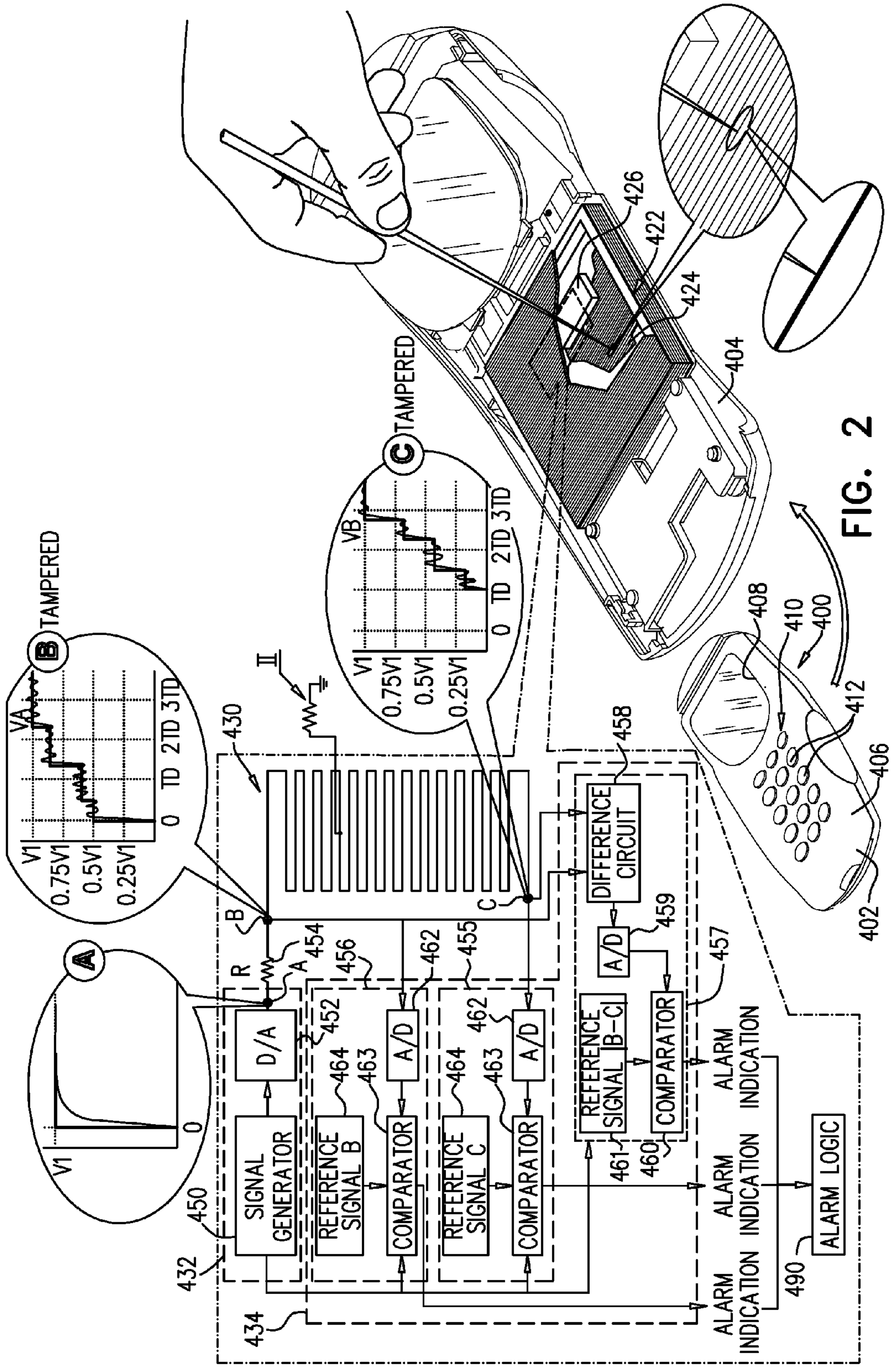
FIG. 2 is a simplified partially pictorial, partially schematic illustration of the operation of the secure keypad device of FIG. 1D responsive to a first type of tampering.

Reference is now made to FIG. 2, which is a simplified schematic illustration of the operation of the secure keypad device of FIG. 1D responsive to a first type of tampering. As seen in FIG. 2, the conductor 430 is tampered with by contact therewith as by a metal object and/or an object having inductance or capacitance, as symbolically shown at II. This tampering causes a change in the signals at junctions B and C, typically as shown, respectively, in signal diagrams B—Tampered and C—Tampered. Normally the difference |B−C| also changes.

Comparators 463, of signal analysis subassemblies 455 and 456, and 460, of signal analysis subassembly 457, which receive respective reference inputs C, B and |B−C|, sense a difference and produce a corresponding alarm indication. Alarm logic 490 provides a suitable alarm indication in accordance with its logic function.

Figure 3:
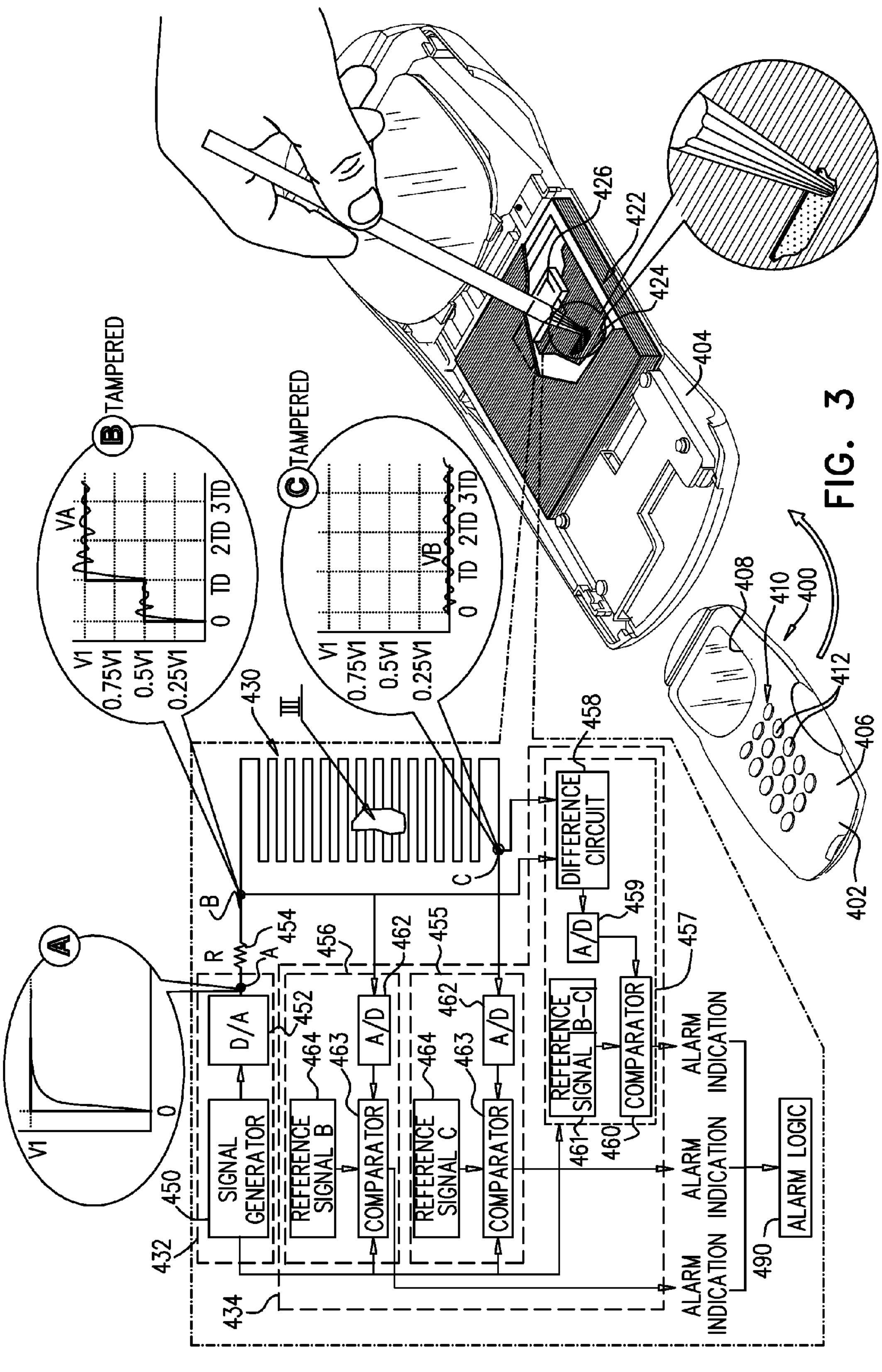
FIG. 3 is a simplified partially pictorial, partially schematic illustration of the operation of the secure keypad device of FIG. 1D responsive to a second type of tampering.

Reference is now made to FIG. 3, which is a simplified schematic illustration of the operation of the secure keypad device of FIG. 1D responsive to a second type of tampering. As seen in FIG. 3, the conductor 430 is cut, as symbolically shown at III. This tampering causes disappearance of the signal at C and typically produces a change in the signal at B, as shown, respectively, in signal diagrams C—Tampered and B—Tampered. The difference |B−C| also changes.

Comparators 463, of signal analysis subassemblies 455 and 456, and 460, of signal analysis subassembly 457, which receive respective reference inputs C, B and |B−C|, sense a difference and produce a corresponding alarm indication. Alarm logic 490 provides a suitable alarm indication in accordance with its logic function.

Figure 4:
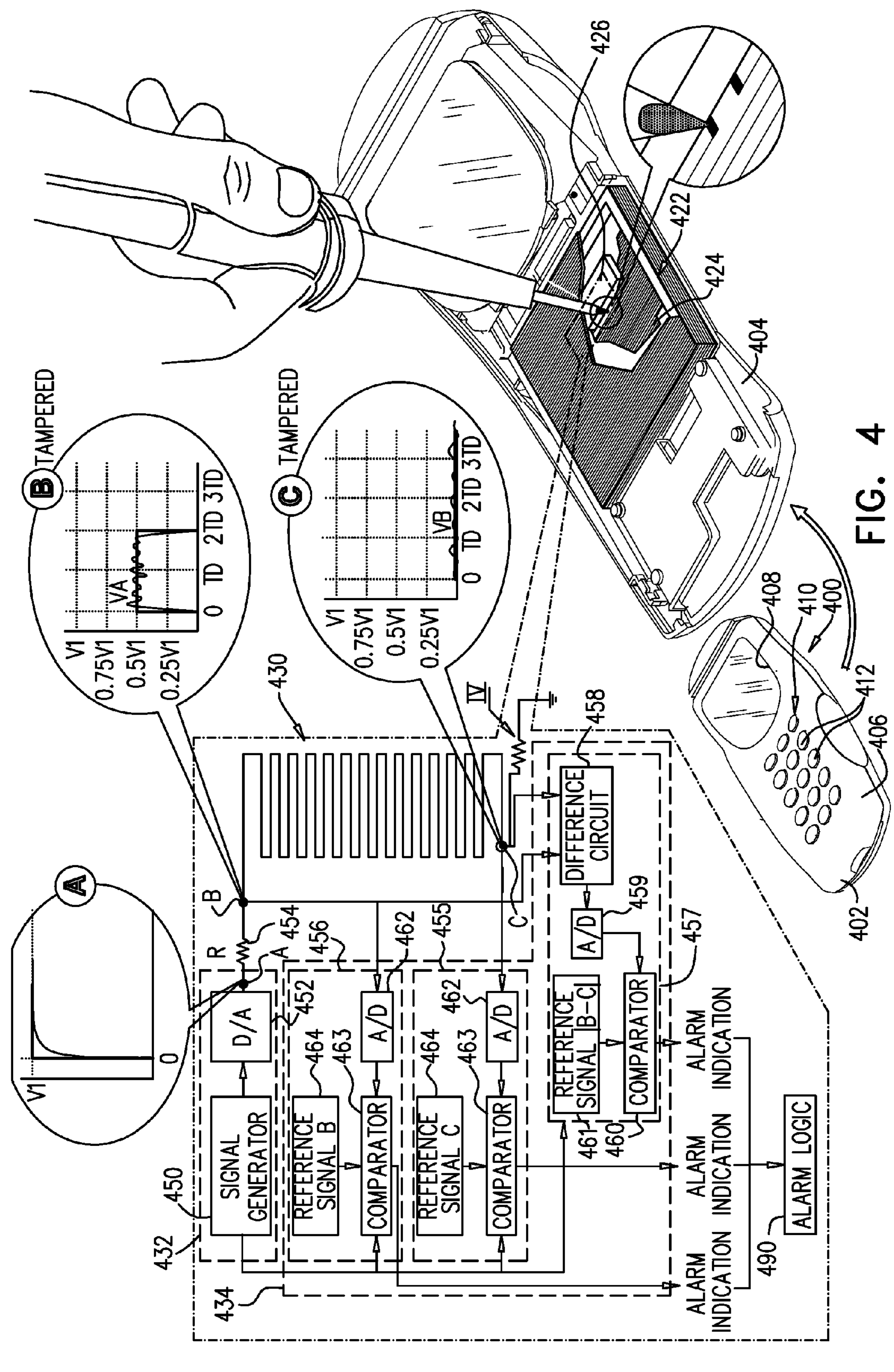
FIG. 4 is a simplified partially pictorial, partially schematic illustration of the operation of the secure keypad device of FIG. 1D responsive to a third type of tampering.

Reference is now made to FIG. 4, which is a simplified schematic illustration of the operation of the secure keypad device of FIG. 1D responsive to a third type of tampering. As seen in FIG. 4, the conductor 430 is shorted to ground at junction C, as symbolically shown at IV. This tampering causes disappearance of the signal at C and typically produces a change in the signal at B, as shown, respectively, in signal diagrams C—Tampered and B—Tampered. The difference |B−C| also changes.

Comparators 463, of signal analysis subassemblies 455 and 456, and 460 of signal analysis subassembly 457, which receive respective reference inputs C, B and |B−C|, sense a difference and produce a corresponding alarm indication. Alarm logic 490 provides a suitable alarm indication in accordance with its logic function.

Figure 5:
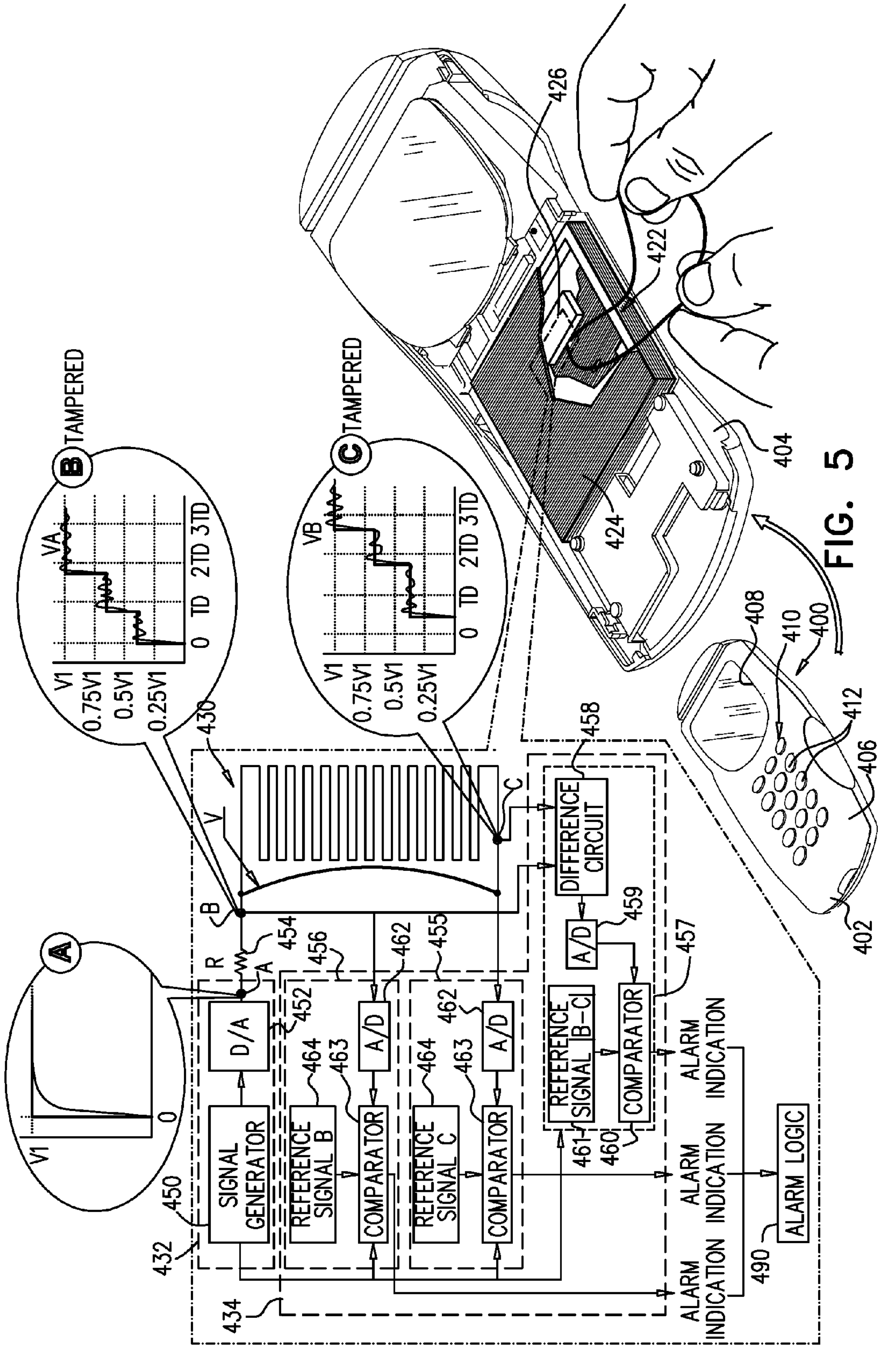
FIG. 5 is a simplified partially pictorial, partially schematic illustration of the operation of the secure keypad device of FIG. 1D responsive to a fourth type of tampering.

Reference is now made to FIG. 5, which is a simplified schematic illustration of the operation of the secure keypad device of FIG. 1D responsive to a fourth type of tampering. As seen in FIG. 5, the junctions B and C are shorted together, as symbolically shown at V. This tampering causes change in the signals at B and C, as shown, respectively, in signal diagrams B—Tampered and C—Tampered. The difference |B−C| also typically changes Comparators 463, of signal analysis subassemblies 455 and 456, and 460, of signal analysis subassembly 457, which receive respective reference inputs C, B and |B−C| sense a difference and produce a corresponding alarm indication. Alarm logic 490 provides a suitable alarm indication in accordance with its logic function. This logic function may be any suitable logic function which provides an alarm output in response to a combination of alarm indications which is indicative of tampering with an acceptably high rate of accuracy and an acceptably low rate of false alarms.

It is appreciated by persons skilled in the art that the present invention is not limited by what has been particularly shown and described hereinabove. Rather the scope of the present invention includes both combinations and subcombinations of various features described hereinabove as well as variations and modifications thereto which would occur to a person of skill in the art upon reading the above description and which are not in the prior art.

The invention claimed is:

1. A secure data entry device comprising:

a housing;

a protective enclosure located within said housing;

tamper sensitive circuitry located within said protective enclosure; and tampering alarm indication circuitry arranged to provide an alarm indication in response to attempted access to said tamper sensitive circuitry, at least part of said tampering alarm indication circuitry being located within said protective enclosure, said tampering alarm indication circuitry comprising:

at least one conductor forming part of said protective enclosure;

a signal generator operative continuously, whether or not the secure data entry device is operative as a secured keypad device, to transmit a signal along said at least one conductor; and a signal analyzer operative to receive said signal transmitted along said at least one conductor and to sense tampering with said at least one conductor, said signal analyzer being operative to sense said tampering by sensing changes in at least one of a rise time and a fall time of said signal, said at least one of said rise time and said fall time being less than a time normally required for said signal to traverse said at least one conductor.

2. A secure data entry device according to claim 1 and wherein said at least one of said rise time and said fall time is less than one hundredth of said time normally required for said signal to traverse said conductor.

3. A secure data entry device according to claim 1 and wherein said signal analyzer compares a reference signal with said signal transmitted along said conductor.

4. A secure data entry device according to claim 3 and wherein said signal analyzer also comprises a reference signal memory.

5. A secure data entry device according to claim 4 and wherein said signal analyzer comprises an analog-to-digital converter and a digital signal comparator.

6. A secure data entry device according to claim 5 and wherein:

said reference signal is a Fast Fourier Transform (FFT) reference signal; and said signal analyzer also comprises a processor including FFT calculation functionality.

7. A secure data entry device according to claim 4 and wherein said signal analyzer comprises a digital-to-analog converter and an analog comparator.

8. A secure data entry device according to claim 1 and wherein said signal generator is also operative to provide a signal timing input to said signal analyzer.

9. A secure data entry device according to claim 1 and wherein said at least one conductor comprises a pair of conductors running in parallel to each other.

10. A secure data entry device according to claim 9 and wherein one of said pair of conductors is grounded.

11. A secure data entry device according to claim 1 and wherein said at least one conductor is routed parallel to a ground plate.

12. A secure data entry device according to claim 1 and wherein said at least one conductor comprises multiple conductors of different lengths.

13. A secure data entry device according to claim 1 and wherein said at least one conductor is formed on a printed circuit substrate.

14. A secure data entry device according to claim 1 and wherein said at least one conductor forms part of at least one of an integrated circuit and a hybrid circuit.

15. A secure data entry device according to claim 1 and wherein said signal generator and said signal analyzer are located within a protective enclosure defined within a secure integrated circuit.

* * * * *